United States Patent
Kim et al.

(10) Patent No.: US 11,640,793 B2
(45) Date of Patent: May 2, 2023

(54) DISPLAY DEVICE AND METHOD OF OPERATING THE SAME

(71) Applicant: Samsung Display Co., Ltd., Yongin-Si (KR)

(72) Inventors: Sungjin Kim, Cheonan-si (KR); Jongwon Park, Yongin-si (KR); Myeonghee Seo, Hwaseong-si (KR); Huigyeong Yun, Hwaseong-si (KR); Seung-Kyu Lee, Asan-si (KR); Younguk Hwang, Asan-si (KR)

(73) Assignee: SAMSUNG DISPLAY CO., LTD., Gyeonggi-do (KR)

(*) Notice: Subject to any disclaimer, the term of this patent is extended or adjusted under 35 U.S.C. 154(b) by 0 days.

(21) Appl. No.: 17/400,589

(22) Filed: Aug. 12, 2021

(65) Prior Publication Data

US 2022/0148511 A1    May 12, 2022

(30) Foreign Application Priority Data

Nov. 12, 2020  (KR) ................. 10-2020-0151391

(51) Int. Cl.
*G09G 3/3266* (2016.01)
*G09G 3/3233* (2016.01)
*G09G 3/3275* (2016.01)

(52) U.S. Cl.
CPC ......... *G09G 3/3266* (2013.01); *G09G 3/3233* (2013.01); *G09G 3/3275* (2013.01);
(Continued)

(58) Field of Classification Search
CPC ............... G09G 3/3696; G09G 3/3266; G09G 2300/0871; G09G 2310/0289;
(Continued)

(56) References Cited

U.S. PATENT DOCUMENTS

| | | | | |
|---|---|---|---|---|
| 6,633,287 B1* | 10/2003 | Yatabe | ................... | G09G 3/367 |
| | | | | 315/169.3 |
| 2015/0269879 A1* | 9/2015 | Shang | ...................... | G09G 3/20 |
| | | | | 345/215 |

(Continued)

FOREIGN PATENT DOCUMENTS

| | | |
|---|---|---|
| KR | 1020170081034 A | 7/2017 |
| KR | 1020170105683 A | 9/2017 |

(Continued)

*Primary Examiner* — Nitin Patel
*Assistant Examiner* — Amen W Bogale
(74) *Attorney, Agent, or Firm* — Cantor Colburn LLP

(57) ABSTRACT

A display device may include a display panel including a plurality of pixels, a data driver which applies data signals to the display panel, a scan driver including scan stages, which sequentially applies scan signals to the display panel, an emission driver including an emission stage which sequentially applies emission signals to the display panel, and a power supply voltage generator which generates a power supply voltage including high voltages and low voltages, and provides the high voltages having different voltage levels from each other or the low voltages having different voltage levels from each other to at least one selected from the scan stages and the emission stage. The power supply voltage generator generates a first high voltage, a first low voltage, a second high voltage lower than the first high voltage, and a second low voltage higher than the first low voltage based on an input voltage.

20 Claims, 12 Drawing Sheets

(52) U.S. Cl.
CPC .............. *G09G 2300/0842* (2013.01); *G09G 2310/0213* (2013.01); *G09G 2310/08* (2013.01); *G09G 2330/021* (2013.01); *G09G 2330/028* (2013.01)

(58) Field of Classification Search
CPC ..... G09G 2310/0267; G09G 2330/028; G09G 2330/021; G11C 19/28
See application file for complete search history.

(56) References Cited

U.S. PATENT DOCUMENTS

| | | | |
|---|---|---|---|
| 2016/0055798 A1* | 2/2016 | Song | G09G 3/3233 345/691 |
| 2018/0114488 A1* | 4/2018 | Jung | G09G 3/3233 |
| 2019/0096330 A1* | 3/2019 | Kim | G09G 3/3266 |

FOREIGN PATENT DOCUMENTS

| KR | 101878380 B1 | 7/2018 |
|---|---|---|
| KR | 1020200015874 A | 2/2020 |
| KR | 1020200037404 A | 4/2020 |

* cited by examiner

DISPLAY DEVICE AND METHOD OF OPERATING THE SAME

This application claims priority to Korean Patent Application No. 10-2020-0151391, filed on Nov. 12, 2020, and all the benefits accruing therefrom under 35 U.S.C. § 119, the content of which in its entirety is herein incorporated by reference.

BACKGROUND

1. Field

Embodiments of the invention relate to a display device and a method of operating the display device. More specifically, embodiments of the invention relate to a display device and a method of operating the display device to control a power supply voltage inputted to a panel driver.

2. Description of the Related Art

A display device typically includes a plurality of panel drivers. The panel drivers may include a data driver, a scan driver, an emission driver, and the like. Among the panel drivers, the scan driver and the emission driver include a plurality of stages for driving a display panel. The stages of the scan driver and the emission driver are typically operated after receiving a same power supply voltage.

SUMMARY

In a display device, there is power consumption undesirably consumed in the stages included in the scan driver and the emission driver. Accordingly, the power consumption undesirably consumed in the stages included in the scan driver and the emission driver is desired to be reduced.

Embodiments of the invention provide a display device including a scan driver and an emission driver having reduced power consumption.

Embodiments of the invention also provide a method of operating a display device to reduce power consumed by a scan driver and an emission driver.

In an embodiment of a display device according to the invention, the display device includes a display panel including a plurality of pixels, a data driver which applies data signals to the display panel, a scan driver including a plurality of scan stages, which sequentially applies scan signals to the display panel, an emission driver including an emission stage which sequentially applies emission signals to the display panel, a controller which controls the scan driver, the emission driver and the data driver, and a power supply voltage generator which generates a power supply voltage including high voltages and low voltages, and provides the high voltages having different voltage levels from each other or the low voltages having different voltage levels from each other to at least one selected from the scan stages and the emission stage. In such an embodiment, the power supply voltage generator generates a first high voltage, a first low voltage, a second high voltage lower than the first high voltage, and a second low voltage higher than the first low voltage, based on an input voltage.

In an embodiment, the power supply voltage generator may include a voltage generating block which generates the first high voltage and the first low voltage based on the input voltage and a voltage scaling block which scales the first high voltage to the second high voltage, and scales the first low voltage to the second low voltage.

In an embodiment, the scan stages may include a writing scan stage, a compensation scan stage, an initialization scan stage, and a bypass scan stage.

In an embodiment, a scan start signal of at least one of the scan stages and a scan clock signal of at least one selected from the scan stages may be toggled between the second high voltage and the second low voltage.

In an embodiment, the voltage scaling block may determine magnitudes of the second high voltage and the second low voltage based on previously stored data.

In an embodiment, the power supply voltage generator may provide the second high voltage and the second low voltage to the compensation scan stage and the initialization scan stage.

In an embodiment, scan start signals of the compensation scan stage and the initialization scan stage and scan clock signals of the compensation scan stage and the initialization scan stage may be toggled between the second high voltage and the second low voltage.

In an embodiment, the power supply voltage generator may provide the first high voltage and the second low voltage to the writing scan stage.

In an embodiment, a scan start signal of the writing scan stage and a scan clock signal of the writing scan stage may be toggled between the first high voltage and the second low voltage.

In an embodiment, the emission start signal of the emission stage and the emission clock signal of the emission stage may be toggled between the second high voltage and the second low voltage.

In an embodiment, a scan start signal of the bypass scan stage and a scan clock signal of the bypass scan stage may be toggled between the second high voltage and the second low voltage.

In an embodiment of a method of operating the display device according to the invention, the method includes generating a first high voltage and a first low voltage based on an input voltage, scaling the first high voltage to a second high voltage lower than the first high voltage, and scaling the first low voltage to a second low voltage higher than the first low voltage, and providing high voltages having different voltage levels from each other or low voltages having different voltage levels from each other to at least one selected from scan stages and an emission stage of the display device.

In an embodiment, the scan stages may include a writing scan stage, a compensation scan stage, an initialization scan stage, and a bypass scan stage.

In an embodiment, the scaling the first high voltage to the second high voltage and the scaling the first low voltage to the second low voltage may include determining magnitudes of the second high voltage and the second low voltage based on previously stored data.

In an embodiment, the providing the high voltages having the different voltage levels from each other or the low voltages having the different voltage levels from each other may include providing the second high voltage and the second low voltage to the compensation scan stage and the initialization scan stage.

In an embodiment, a scan start signal of the compensation scan stage and the initialization scan stage, and a scan clock signal of the compensation scan stage and the initialization scan stage may be toggled between the second high voltage and the second low voltage.

In an embodiment, the providing the high voltages having the different voltage levels from each other or the low voltages having the different voltage levels from each other may include providing the first high voltage and the second low voltage to the writing scan stage.

In an embodiment, a scan start signal of the writing scan stage and a scan clock signal of the writing scan stage may be toggled between the first high voltage and the second low voltage.

In an embodiment, an emission start signal of the emission stage and an emission clock signal of the emission stage may be toggled between the second high voltage and the second low voltage.

In an embodiment, a scan start signal of the bypass scan stage and a scan clock signal of the bypass scan stage may be toggled between the second high voltage and the second low voltage.

In embodiments of the invention, the display device may selectively output the power supply voltage used for the stages of the scan driver and the emission driver, so that the power undesirably consumed in driving the scan driver and the emission driver may be minimized. Accordingly, the display device may improve the overall efficiency of the power consumption.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
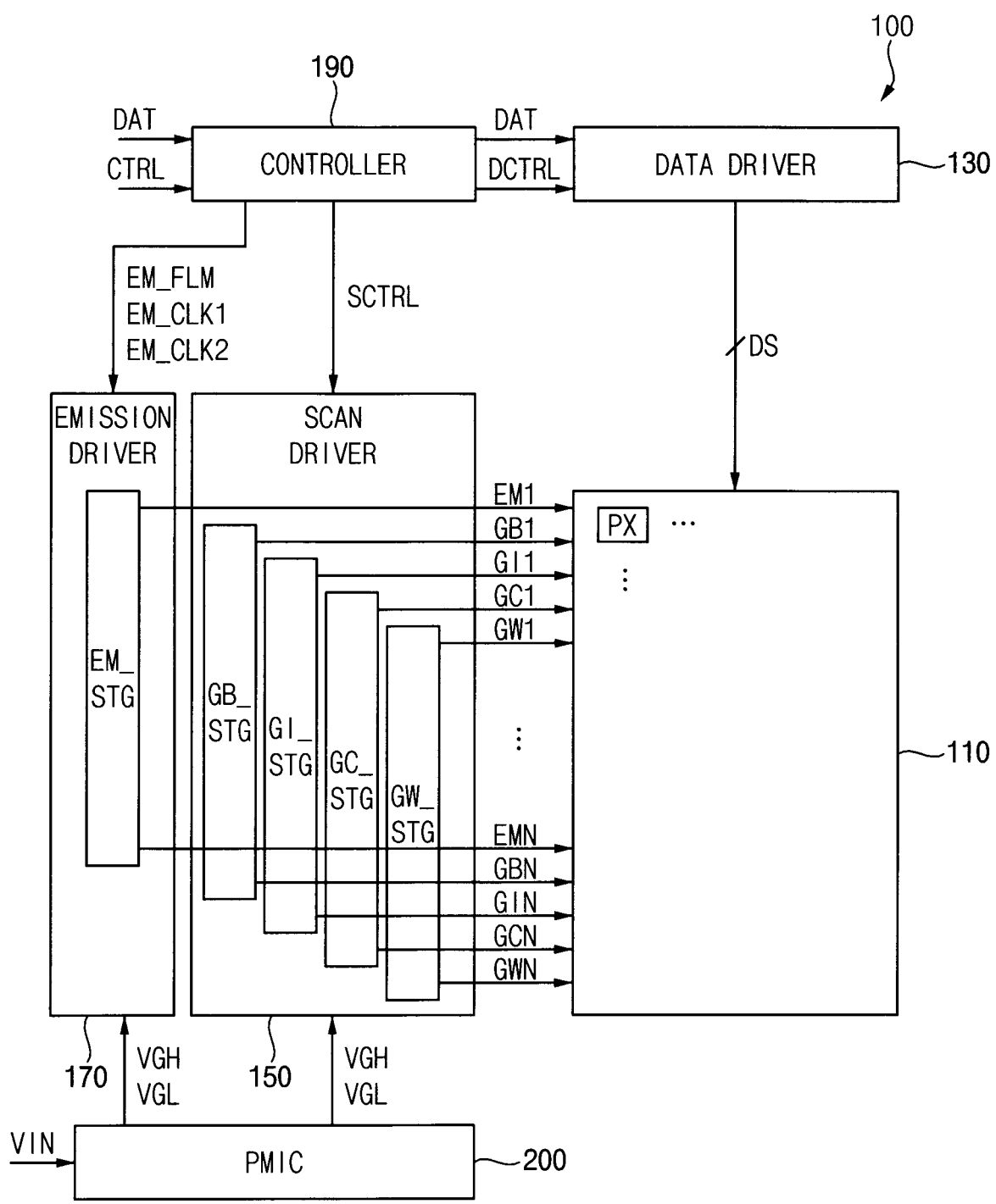
FIG. 1 is a block diagram illustrating a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings. The same reference numerals are used for the same components in the drawings, and any repetitive detailed descriptions of the same components will be omitted or simplified.

Figure 2:
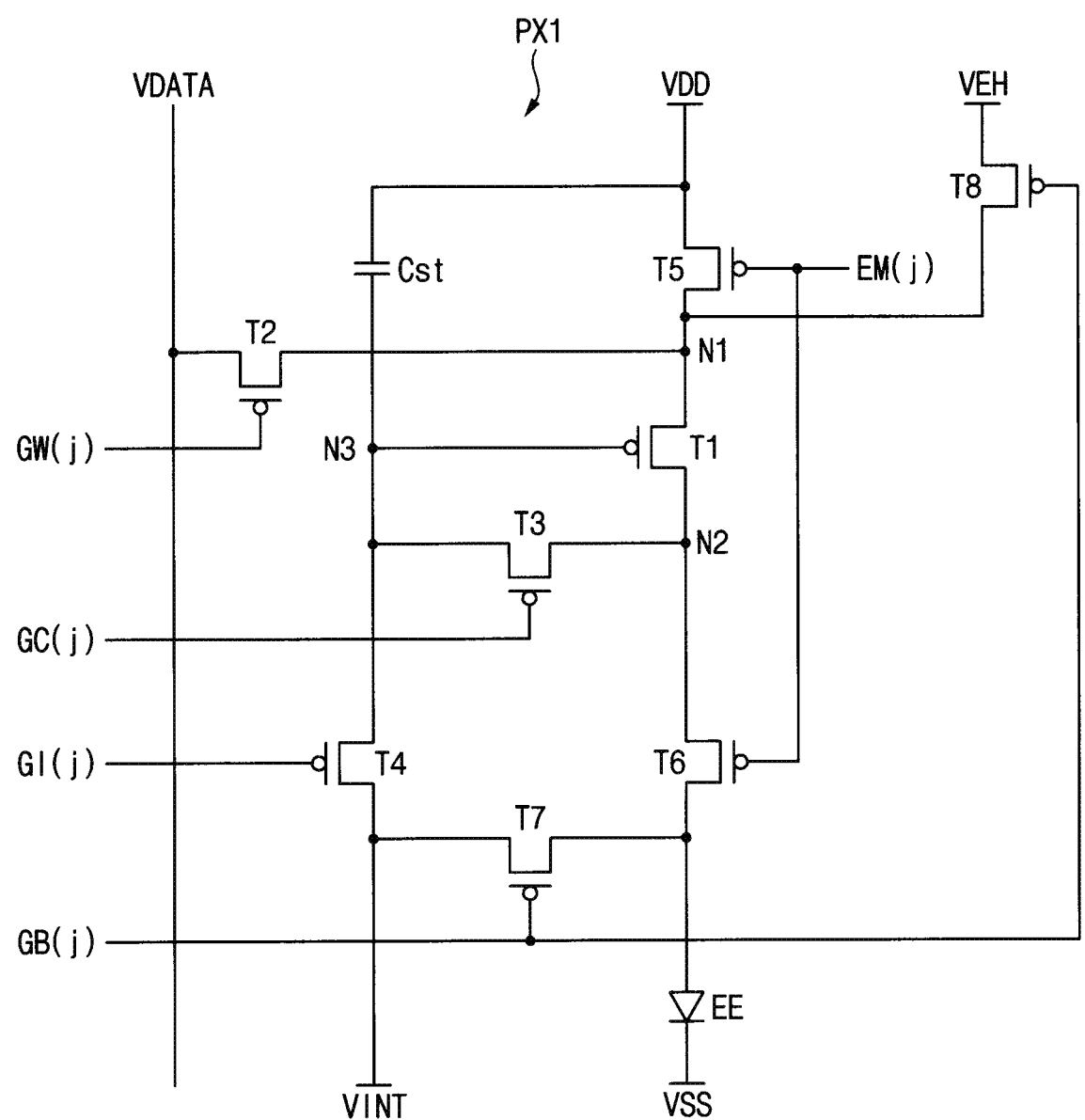
FIG. 2 is a circuit diagram illustrating a pixel included in the display device of FIG. 1.
Figure 3:
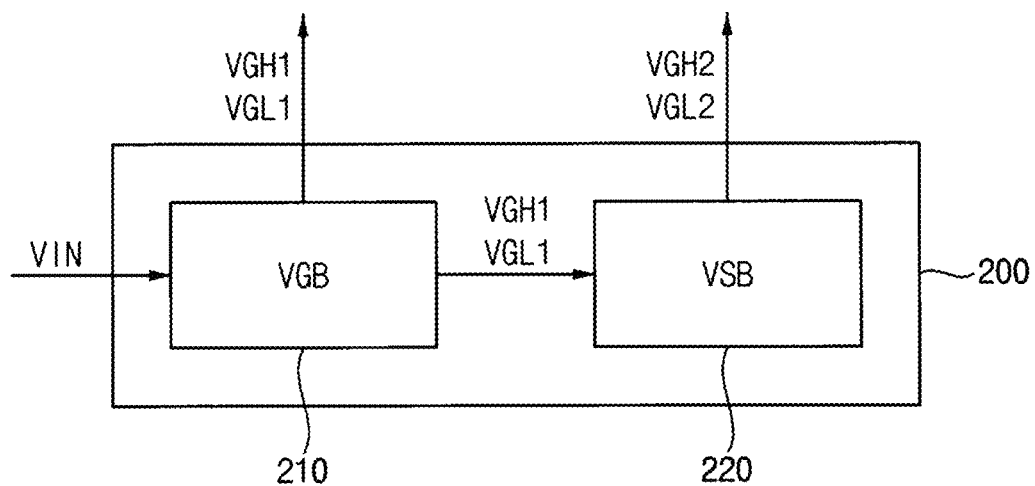
FIG. 3 is a block diagram illustrating an embodiment of a power supply voltage generator included in the display device of FIG. 1.

FIG. 1 a block diagram illustrating a display device 100 according to an embodiment of the invention. FIG. 2 is a circuit diagram illustrating a pixel PX included in the display device of FIG. 1. FIG. 3 is a block diagram illustrating an example of a power supply voltage generator 200 included in the display device 100 of FIG. 1.

Referring to FIG. 1, an embodiment of the display device 100 according to the invention includes: a display panel 110, a data driver 130 which provides data signals DS to the display panel 110, a scan driver 150 which provides writing scan signals GW1 to GWN, compensation scan signals GC1 to GCN, initialization scan signals GI1 to GIN, and bypass scan signals GB1 to GBN to the display panel 110, an emission driver 170 which provides emission signals EM1 to EMN to the display panel 110, a controller 190 which controls the data driver 130, the scan driver 150 and the emission driver 170, and a power supply voltage generator 200 which provides power supply voltages to the scan driver 150 and the emission driver 170.

The display panel 110 may include a plurality of data lines, a plurality of writing scan lines, a plurality of compensation scan lines, a plurality of initialization scan lines, a plurality of bypass scan lines, a plurality of emission lines, and a plurality of pixels PX connected thereto. The display panel 110 may be an organic light emitting diode ("OLED") display panel in which each pixel PX includes an OLED.

In an embodiment, a pixel PX1, as shown in FIG. 2, may include light emitting element EE and a plurality of transistors, e.g., first to eighth transistors T1 to T8. The pixel PX1 shown in FIG. 2 may be a pixel in a j-th pixel row among the pixels PX arranged in a matrix form, where j is a natural number. A first electrode of the light emitting element EE may be connected to the sixth transistor T6, and a second electrode of the light emitting element EE may be connected to a second power source VSS. The light emitting element EE may include an OLED or an inorganic light emitting diode. The light emitting element EE may generate light having a predetermined luminance corresponding to a driving current supplied from the first transistor T1.

The first transistor T1 may be connected between a first node N1 electrically connected to a first power source VDD and a second node N2 electrically connected to the first electrode of the light emitting element EE. The first transistor T1 may generate the driving current and provide the driving current to the light emitting element EE. A gate electrode of the first transistor T1 may be connected to a third node N3. The first transistor T1 functions as a driving transistor of the pixel PX.

The second transistor T2 may be connected between the data line and the first node N1. The second transistor T2 may include a gate electrode which receives the writing scan signal GW(j).

The third transistor T3 may be connected between the second node N2 and the third node N3. The third transistor T3 may include a gate electrode which receives the compensation scan signal GC(j). When the third transistor T3 is turned on, the first transistor T1 may be connected in the form of a diode. In other words, the third transistor T3 may serve to write data voltage VDATA with respect to the first transistor T1 and compensate for a threshold voltage.

A storage capacitor Cst may be connected between the first power source VDD and the third node N3. A storage capacitor Cst may store the data voltage VDATA and a voltage corresponding to a threshold voltage of the first transistor T1.

The fourth transistor T4 may be connected between the third node N3 and a third power source VINT. The fourth transistor T4 may include a gate electrode which receives the initialization scan signal GI(j). In an embodiment, the initialization scan signal GI(j) may correspond to a compensation scan signal GC(j−1) of a previous pixel row. When the fourth transistor T4 is turned on, the gate voltage of the first transistor T1 may be initialized to a voltage of the third power source VINT. In an embodiment, the third power source VINT may be set to a voltage less or lower than the lowest voltage of the data voltage.

The fifth transistor T5 may be connected between the first power source VDD and the first node N1. The fifth transistor T5 may include a gate electrode which receives the emission signal EM(j).

The sixth transistor T6 may be connected between the second node N2 and the first electrode of the light emitting element EE. The sixth transistor T6 may include a gate electrode which receives the emission signal EM(j).

The fifth and sixth transistors T5 and T6 may be turned on in a gate-on period of the emission signal EM(j), and may be turned off in a gate-off period of the emission signal EM(j).

The seventh transistor T7 may be connected between the third power source VINT and the first electrode of the light emitting element EE. The seventh transistor T7 may include a gate electrode which receives the bypass scan signal GB(j). In an embodiment, the bypass scan signal GB(j) may correspond to the writing scan signal GW(j). Alternatively, the bypass scan signal GB(j) may correspond to a writing scan signal GW(j−1) supplied to the previous pixel row or a writing scan signal GW(j+1) supplied to a next pixel row.

The eighth transistor T8 may be connected between a high level emission power VEH and the first node N1. The eighth transistor T8 may include a gate electrode which receives the bypass scan signal GB(j).

Herein, the writing scan signal GW(j), the compensation scan signal GC(j), the initialization scan signal GI(j), and the bypass scan signal GB(j) are merely terms, for convenience of description, that identify scan signals provided to different components in the pixel PX1, and functions of the scan signals are not limited thereto.

In an embodiment, each of the first, second, fifth, sixth, seventh and eighth transistors T1, T2, T5, T6, T7, and T8 may be a P-type low-temperature poly-silicon ("LTPS") thin film transistor, and each of the third and fourth transistors T3 and T4 may be an N-type oxide semiconductor thin film transistor. Since the N-type oxide semiconductor thin film transistor has better current leakage characteristics than the P-type LTPS thin film transistor, the third and fourth transistors T3 and T4, which are switching transistors, may be formed as or defined by the N-type oxide semiconductor thin film transistor. Accordingly, the leakage current in the third and fourth transistors T3 and T4 is substantially reduced, and thus power consumption may be reduced.

The data driver 130 may provide data signals DS (or the data voltage VDATA) to the pixels PX based on image data DAT and data control signals DCTRL received from the controller 190. In an embodiment, the data control signal DCTRL may include a horizontal start signal and a load signal, but the invention is not limited thereto.

The scan driver 150 may sequentially provide, in a pixel row unit (or pixel-row by pixel-row), writing scan signals GW1 to GWN, compensation scan signals GC1 to GCN, initialization scan signals GI1 to GIN, and bypass scan signals GB1 to GBN to the pixels PX, based on a scan control signal SCTRL received from the controller 190. In an embodiment, the scan control signal SCTRL may include a writing scan start signal, first and second writing scan clock signals, a compensation scan start signal, first and second compensation scan clock signals, an initialization scan start signal, first and second initialization scan clock signals, a bypass scan start signal, and first and second bypass scan clock signals, but the invention is not limited thereto.

In an embodiment, as shown in FIG. 1, the scan driver 150 may include a plurality of writing scan stages GW_STG which sequentially outputs the writing scan signals GW1 to GWN, a plurality of compensation scan stages GC_STG which sequentially outputs the compensation scan signals GC1 to GCN, a plurality of initialization scan stages GI_STG which sequentially outputs the initialization scan signals GI1 to GIN, and a plurality of bypass scan stages GB_STG which sequentially outputs the bypass scan signals GB1 to GBN. In one embodiment, for example, the writing scan stages GW_STG may sequentially output the first to N-th writing scan signals GW1 to GWN to the pixels PX based on the writing scan start signals and the first and second writing scan clock signals. In such an embodiment, the compensation scan stages GC_STG may sequentially output the first to N-th compensation scan signals GB1 to GBN to the pixels PX based on the compensation scan start signals and the first and second compensation scan clock signals. In such an embodiment, the initialization scan stages GI_STG may be sequentially output the first to N-th initialization scan signals GI1 to GIN to the pixels PX based on the initialization scan start signals and the first and second initialization scan clock signals. In such an embodiment, the bypass scan stages GB_STG may be sequentially output the first to N-th bypass scan signals GB1 to GBN to the pixels PX based on the bypass scan start signals and the first and second bypass scan clock signals. Here, N is a natural number greater than or equal to j.

In an embodiment, as shown in FIG. 1, the writing scan signal GW, the compensation scan signal GB, the initialization scan signal GI, and the bypass scan signal GB are outputted by different stages GW_STG, GB_STG, GI_STG, and GB_STG, but not being limited thereto. Alternatively, at least some of the writing scan signal GW, the compensation scan signal GB, the initialization scan signal GI, and the bypass scan signal GB may be outputted by a same stage.

The emission driver 170 may sequentially provide the emission signals EM1 to EMN to the pixels PX based on an emission driver control signal received from the controller 190. In an embodiment, the emission driver control signal may include an emission start signal EM_FLM, first emission clock signal EM_CLK1 and second emission clock signal EM_CLK2, but the invention is not limited thereto. In an embodiment, the emission driver 170 may include a plurality of emission stages EM_STG which sequentially outputs the emission signals EM1 to EMN.

FIG. 1 illustrates an embodiment in which the scan driver 150 and the emission driver 170 are disposed only on one side of the display panel 110. In an alternative embodiment, the scan driver 150 and the emission driver 170 may be disposed on both of opposing sides of the display panel 110.

The controller (for example, a timing controller) 190 may receive image data DAT and a control signal CTRL from an external host (for example, a graphic processing unit ("GPU") or a graphic card). In an embodiment, the control signal CTRL may include a main clock signal, a vertical synchronization signal, a horizontal synchronization signal, a data enable signal, and the like, but the invention is not limited thereto. The controller 190 may control the data driver 130 by providing the image data DAT and the data control signal DCTRL to the data driver 130, may control the scan driver 150 by providing the scan control signal SCTRL to the scan driver 150, and may control the emission driver 170 by providing the emission start signal EM_FLM and the emission clock signals EM_CLK1 and EM_CLK2 to the emission driver 170.

Referring to FIGS. 1 and 3, in an embodiment, the power supply voltage generator 200 may generate a power supply voltage including high voltages VGH and low voltages VGL. In such an embodiment, the power supply voltage generator 200 may receive an input voltage VIN and generate high voltages VGH and low voltages VGL for driving the scan driver 150 and the emission driver 170. The power supply voltage generator 200 may provide the high voltage VGH and the low voltage VGL to the scan driver 150 and the emission driver 170. The power supply voltage generator 200 may generate a first high voltage VGH1, a first low voltage VGL1, a second high voltage VGH2 less or lower than the first high voltage VGH1, and a second low voltage VGL2 greater or higher than the first low voltage VGL1, based on the input voltage. The power supply voltage generator 200 may include a voltage generating block (VGB in FIG. 3) 210 which generates the first high voltage VGH1 and the first low voltage VGL1, and a voltage scaling block (VSB in FIG. 3) 220 which scales the first high voltage VGH1 to the second high voltage VGH2 less or lower than the first high voltage VGH1, and scales the first low voltage VGL1 to the second low voltage VGL2 greater or higher than the first low voltage VGL1.

In an embodiment, the voltage generating block 210 may receive the input voltage VIN and generate a first high voltage VGH1 and a first low voltage VGL1 for driving the scan driver 150 and the emission driver 170. The voltage generating block 210 may output the first high voltage VGH1 and the first low voltage VGL1 to the scan driver 150 and the emission driver 170. In such an embodiment, the voltage generating block 210 may transfer the first high voltage VGH1 and the first low voltage VGL1 to the voltage scaling block 220. The voltage scaling block 220 may receive the first high voltage VGH1 and the first low voltage VGL1 from the voltage generating block 210. The voltage scaling block 220 may scale the first high voltage VGH1 to a second high voltage VGH2 less or lower than the first high voltage VGH1. The voltage scaling block 220 may scale the first low voltage VGL1 to a second low voltage VGL2 greater or higher than the first low voltage VGL1. The voltage scaling block 220 may output the second high voltage VGH2 and the second low voltage VGL2 to the scan driver 150 and the emission driver 170.

In an embodiment, the voltage scaling block 220 may determine magnitudes of the second high voltage VGH2 and the second low voltage VGL2 based on previously stored data. In such an embodiment, the voltage generator may store a data sheet including optimal driving voltage information of each of the scan stages and the emission stages according to the input voltage. The voltage scaling block 220 may determine magnitudes of the second high voltage VGH2 and the second low voltage VGL2 based on the data stored in the data sheet, and accordingly scale the second high voltage VGH2 and the second low voltage VGL2.

In an embodiment, the power supply voltage generator 200 may output voltages having different voltage levels from each other to the writing scan stages GW_STG, the compensation scan stages GC_STG, the initialization scan stages GI_STG, the bypass scan stages GB_STG, and the emission stages EM_STG. In such an embodiment, the power supply voltage generator 200 may selectively output one of the first high voltage VGH1 and the second high voltage VGH2 to each of the writing scan stages GW_STG, the compensation scan stages GC_STG, the initialization scan stages GI_STG, the bypass scan stages GB_STG, and the emission stages EM_STG. In such an embodiment, the power supply voltage generator 200 may selectively output one of the first low voltage VGL1 and the second low voltage VGL2 to each of the writing scan stages GW_STG, the compensation scan stages GC_STG, the initialization scan stages GI_STG, the bypass scan stages GB_STG, and the emission stages EM_STG. In one embodiment, for example, when the power supply voltage generator 200 outputs the first high voltage VGH1 and the first low voltage VGL1 to some of the writing scan stages GW_STG, the compensation scan stages GC_STG, the initialization scan stages GI_STG, the bypass scan stages GB_STG, and the emission stages EM_STG, the power supply voltage generator 200 may provide the first high voltage VGH1 and the first low voltage VGL1 outputted from the voltage generating block 210 to some of the writing scan stages GW_STG, the compensation scan stages GC_STG, the initialization scan stages GI_STG, the bypass scan stages GB_STG, and the emission stages EM_STG. In one alternative embodiment, for example, when the power supply voltage generator 200 outputs the second high voltage VGH2 and the second low voltage VGL2 to some of the writing scan stages GW_STG, the compensation scan stages GC_STG, the initialization scan stages GI_STG, the bypass scan stages GB_STG, and the emission stages EM_STG, the power supply voltage generator 200 may provide the second high voltage VGH2 and the second low voltage VGL2 scaled from the voltage scaling block 220 to some of the writing scan stages GW_STG, the compensation scan stages GC_STG, the initialization scan stages GI_STG, the bypass scan stages GB_STG, and the emission stages EM_STG.

Thus, an embodiment of the display device 100 according to the invention may selectively output the power supply voltage used for a plurality of stages GW_STG, GC_STG, GI_STG and GB_STG of the scan driver 150, and EM_STG of the emission driver 170, so that the power undesirably consumed in driving the scan driver 150 and the emission driver 170 may be minimized. Accordingly, in such an embodiment, the display device 100 may improve the overall efficiency of the power consumption.

Figure 4:
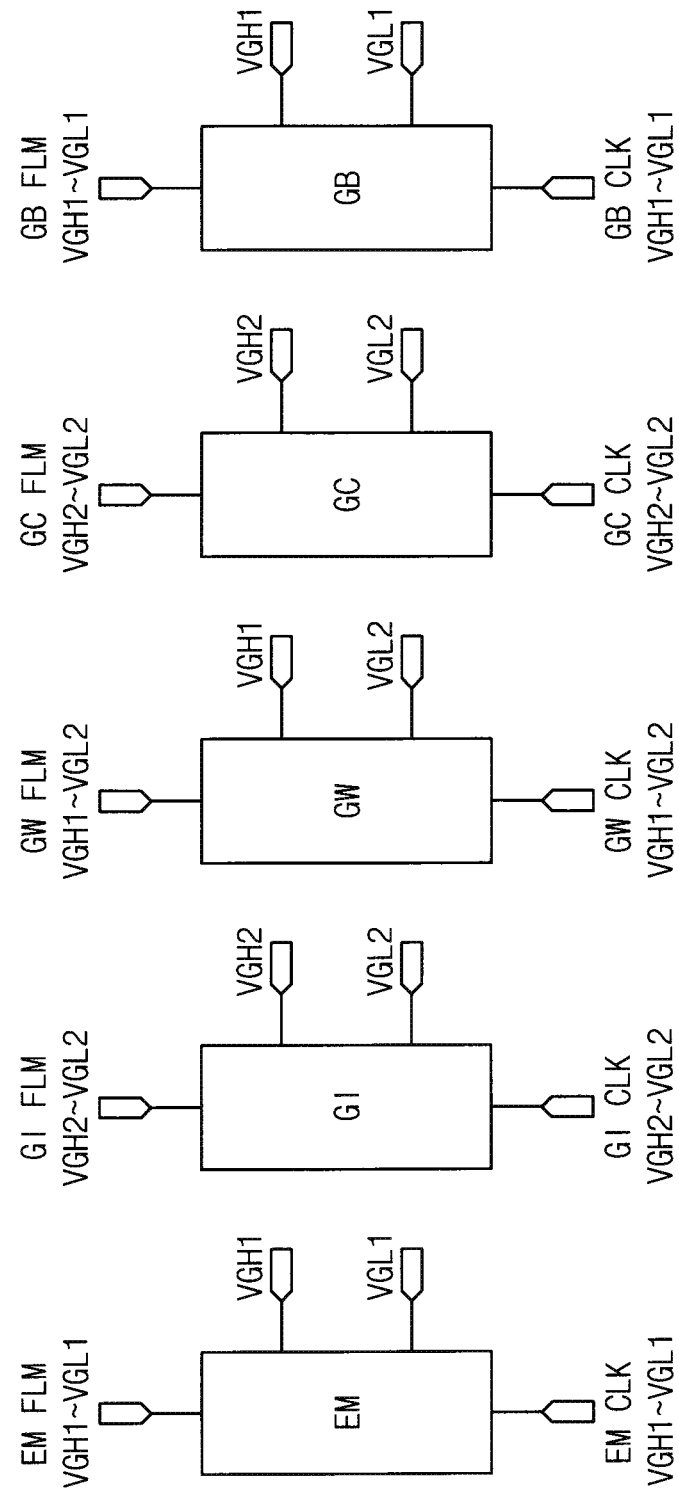
FIG. 4 is a diagram illustrating an embodiment in which a power supply voltage is applied to a scan driver and an emission driver.
Figure 5A:
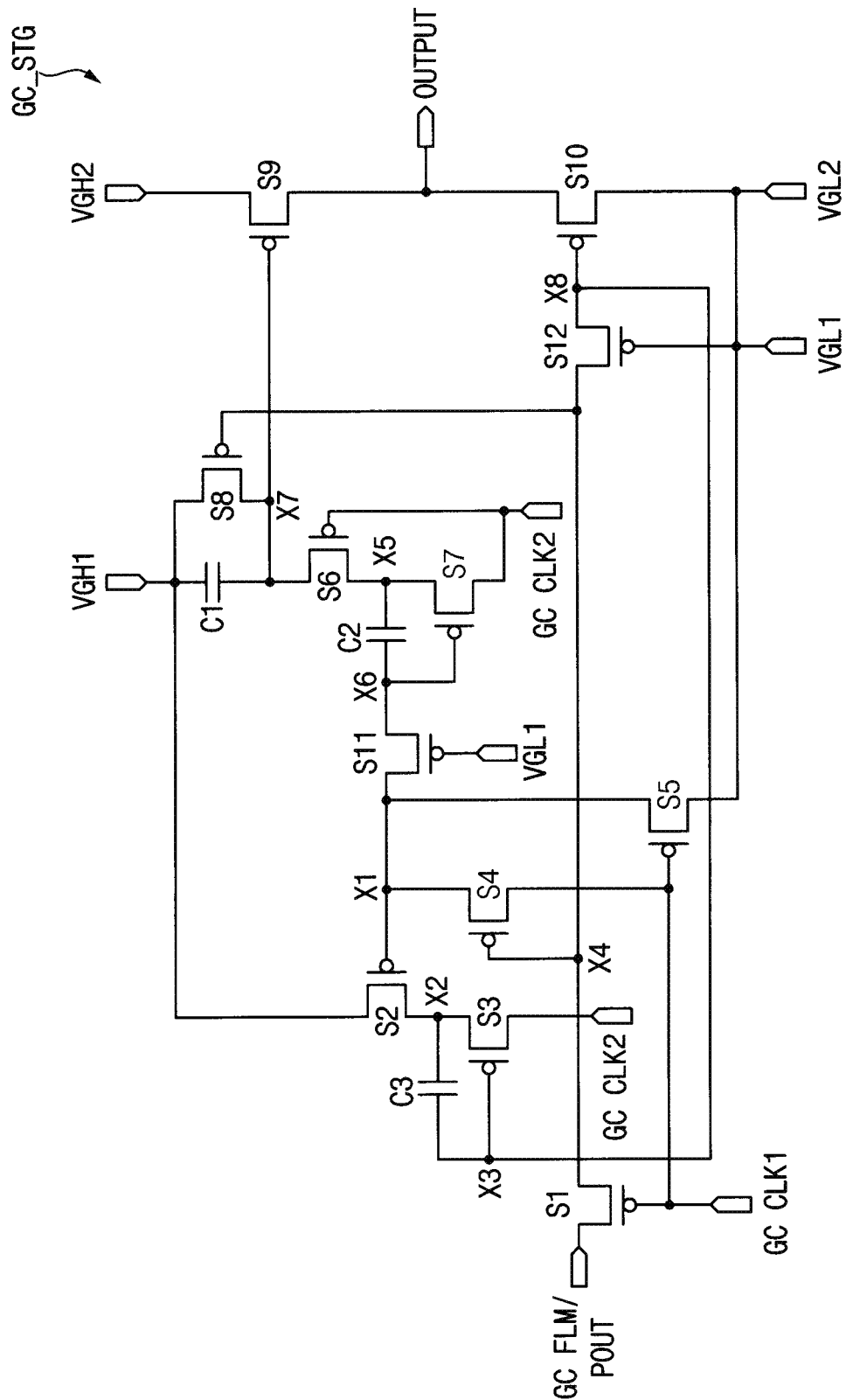
FIG. 5A is a circuit diagram illustrating a compensation scan stage according to an embodiment of the invention.
Figure 5B:
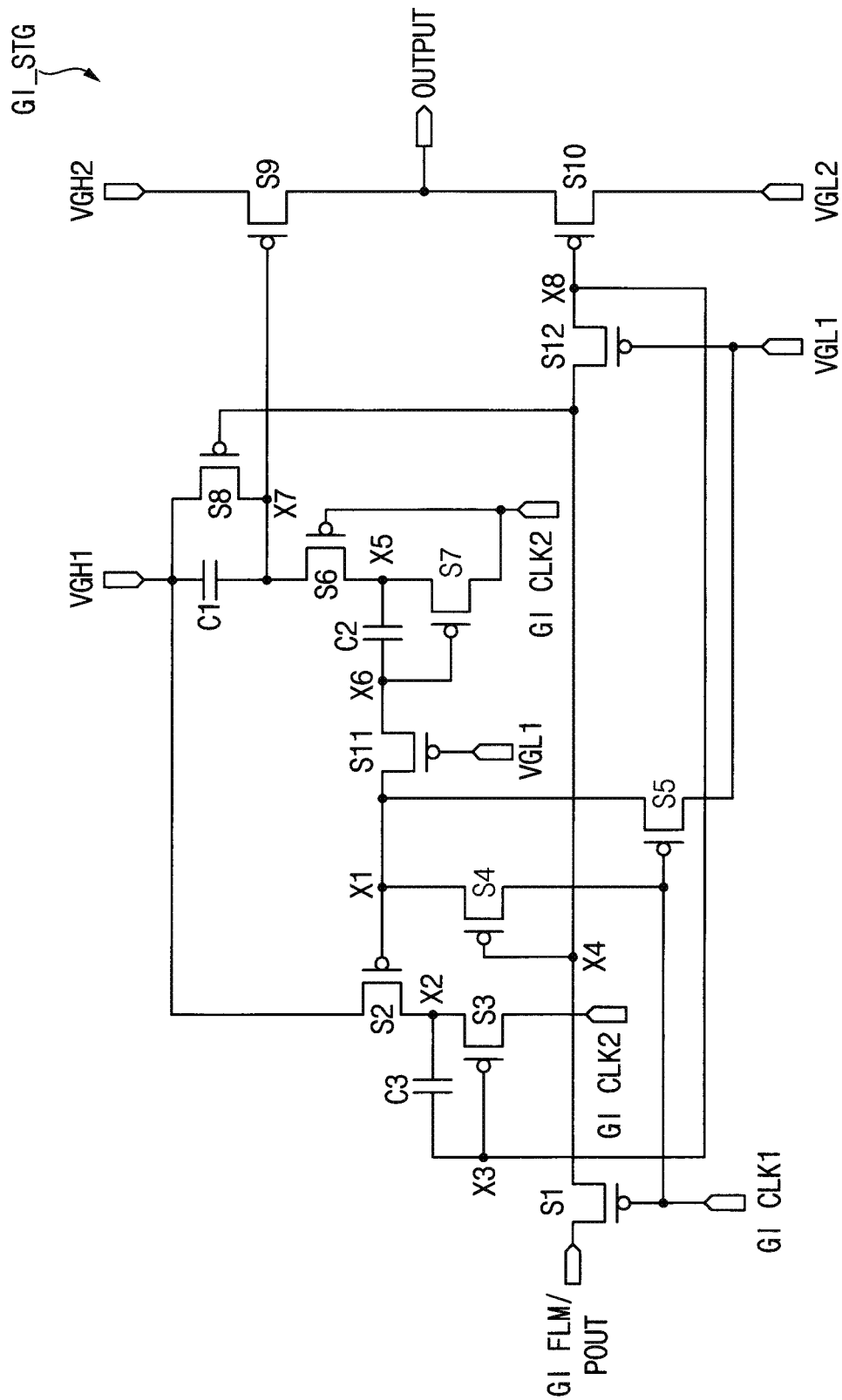
FIG. 5B is a circuit diagram illustrating an initialization scan stage according to an embodiment of the invention.
Figure 6:
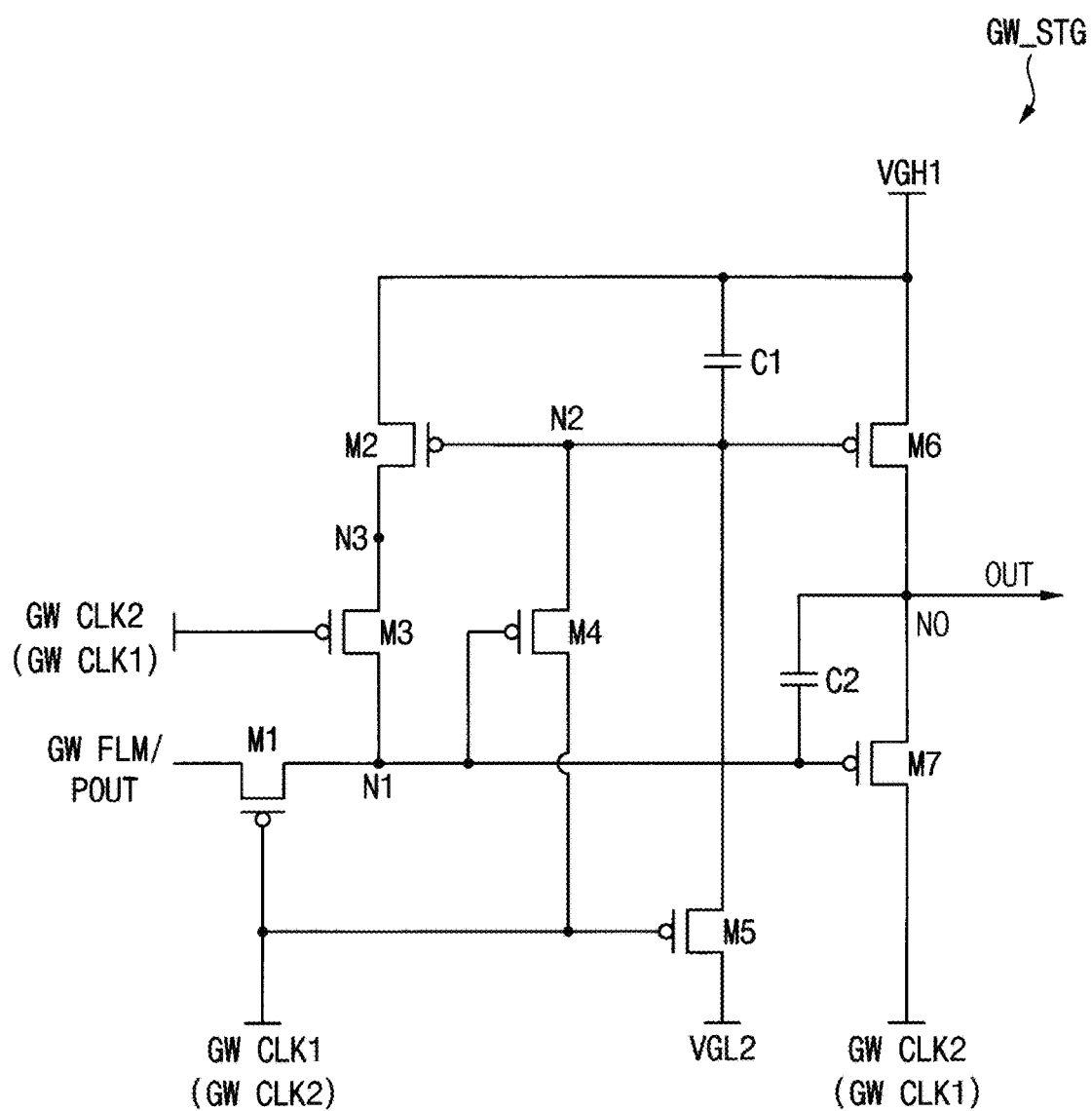
FIG. 6 is a block diagram illustrating a writing scan stage according to an embodiment of the invention.

FIG. 4 is a diagram illustrating an embodiment in which a power supply voltage is applied to the scan driver 150 and the emission driver 170. FIG. 5A is a circuit diagram illustrating the compensation scan stage GC_STG according to an embodiment of the invention. FIG. 5B is a circuit diagram illustrating the initialization scan stage GI_STG according to an embodiment of the invention. FIG. 6 is a block diagram illustrating the writing scan stage GW_STG according to an embodiment of the invention.

Referring to FIGS. 4 to 6, in an embodiment, the power supply voltage generator 200 may output voltages having different voltage levels from each other to the writing scan stages GW_STG, the compensation scan stages GC_STG, the initialization scan stages GI_STG, the bypass scan stages GB_STG, and the emission stages EM_STG. In such an embodiment, the scan start signal GI FLM, GW FLM, GC FLM or GB FLM and the scan clock signal GI CLK, GW CLK, GC CLK or GB CLK (or emission start signal EM FLM and emission clock signal EM CLK) of at least one selected from the writing scan stages GW_STG, the compensation scan stages GC_STG, the initialization scan stages GI_STG, the bypass scan stages GB_STG, and the emission stages EM_STG may be toggled between the second high voltage VGH2 and the second low voltage VGL2.

In an embodiment, the power supply voltage generator 200 may selectively output one of the first high voltage VGH1 and the second high voltage VGH2 to each of the writing scan stages GW_STG, the compensation scan stages GC_STG, the initialization scan stages GI_STG, the bypass scan stages GB_STG, and the emission stages EM_STG. In such an embodiment, the power supply voltage generator 200 may selectively output one of the first low voltage VGL1 and the second low voltage VGL2 to each of the writing scan stages GW_STG, the compensation scan stages GC_STG, the initialization scan stages GI_STG, the bypass scan stages GB_STG, and the emission stages EM_STG. In one embodiment, for example, as shown in FIG. 4, the power supply voltage generator 200 may output the first high voltage VGH1 and the first low voltage VGL1 to the bypass scan stages GB_STG and the emission stages EM_STG, may output the second high voltage VGH2 and the second low voltage VGL2 to the compensation scan stages GC_STG and the initialization scan stages GI_STG, and may output the first high voltage VGH1 and the second low voltage VGL2 to the writing scan stages GW_STG.

Referring to FIG. 5A, in the compensation scan stages GC_STG, a voltage applied to an output terminal which outputs the output signal OUTPUT may be separated from a driving voltage inside the stage. A voltage, e.g., the second high voltage VGH2 and the second low voltage VGL2, different from the driving voltage inside the stage, e.g., the first high voltage VGH1 and the first low voltage VGL1, may be applied to the output voltage. In one embodiment, for example, the compensation scan stages GC_STG may include a pull-down unit for operations of pulling down the output signal OUTPUT to the second low voltage VGL2. The compensation scan stages GC_STG may include a pull-up unit for operations of raising up the output signal OUTPUT to the second high voltage VGH2. A first switching element S1 may transfer a compensation scan start signal GC FLM to a fourth node X4 in response to a first compensation scan clock signal GC CLK1. A fourth switching element S4 may control a connection between the first compensation scan clock signal GC CLK1 and a first node X1 in response to a signal from the fourth node X4. A fifth switching element S5 may control a connection between the first low voltage VGL1 and the first node X1 in response to the first compensation scan clock signal GC CLK1. Second and third switching elements S2 and S3 may be connected in series between a second node X2 and the first high voltage VGH1. The third switching element S3 may control a connection between an eighth switching element S8 and the second node X2 in response to the second compensation scan clock signal GC CLK2. The eighth switching element S8 may control a connection between the first high voltage VGH1 and a seventh node X7 in response to a signal from the fourth node X4. The seventh switching element S7 may control a connection between the second compensation scan clock signal GC CLK2 and a fifth node X5 in response to a signal from a sixth node X6. A sixth switching element S6 may control a connection between the fifth node X5 and the seventh node X7 in response to the second compensation scan clock signal GC CLK2. A first capacitor C1 may control a connection between the high first high voltage VGH1 and the seventh node X7. A second capacitor C2 may be connected between the fifth node X5 and the sixth node X6, and a third capacitor C3 may be connected between the second node X2 and the third node X3. An eleventh switching element S11 may control a connection between the first node X1 and the sixth node X6 in response to the first low voltage VGL1, and a twelfth switching element S12 may control a connection between the fourth node X4 and an eighth node X8 in response to the first low voltage VGL1.

In such an embodiment, a ninth switching element S9 may control a connection between the second high voltage VGH2 and the output terminal in response to the signal from the seventh node X7, and a tenth switching element S10 may control a connection between the second low voltage VGL2 and the output terminal in response to a signal from the eighth node X8. Accordingly, when the output voltages of the compensation scan stages GC_STG are separated from the driving voltage inside the stage and thus the second high voltage VGH2 and the second low voltage VHL2 are applied to the output terminal, the power undesirably consumed in driving the compensation scan stages GC_STG may be minimized. Accordingly, the display device can improve the overall efficiency of the power consumption.

In an embodiment, the power supply voltage generator 200 may toggle the compensation scan start signal GC FLM and the compensation scan clock signal GC CLK inputted to the compensation scan stages GC_STG to the second high voltage VGH2 and the second low voltage VGL2. In such an embodiment, the compensation scan start signals GC FLM and the compensation scan clock signals GC CLK1 and GC CLK2 toggled between the second high voltage VGH2 and the second low voltage VGL2 may be applied to the compensation scan stages GC_STG. Accordingly, since the power consumption by the compensation scan start signal and the compensation scan clock signal is reduced in the compensation scan stages GC_STG, the display device may additionally reduce the power consumption.

Referring to FIG. 5B, in the initialization scan stages GI_STG, a voltage applied to an output terminal, which outputs the output signal OUTPUT may be separated from a driving voltage inside the stage. A voltage, e.g., the second high voltage VGH2 and the second low voltage VGL2, different from the driving voltage inside the stage, e.g., the first high voltage VGH1 and the first low voltage VGL1, may be applied to the output voltage. In one embodiment, for example, the initialization scan stages GI_STG may include a pull-down unit for operations of pulling down the output signal OUTPUT to the second low voltage VGL2. The initialization scan stages GI_STG may include a pull-up unit for operations of raising up the output signal OUTPUT to the second high voltage VGH2. The first switching element S1 may transfer an initialization scan start signal GI FLM to the fourth node X4 in response to a first initialization scan clock signal GI CLK1. The fourth switching element S4 may control a connection between the first initialization scan clock signal GI CLK1 and the first node X1 in response to the signal from the fourth node X4. The fifth switching element S5 may control a connection between the first low voltage VGL1 and the first node X1 in response to the first initialization scan clock signal GI CLK1. Second and third switching elements S2 and S3 may be connected in series between a second node X2 and the first high voltage VGH1. The third switching element S3 may control a connection between the eighth switching element S8 and the second node X2 in response to a second initialization scan clock signal GI CLK2. The eighth switching element S8 may control a connection between the first high voltage VGH1 and a seventh node X7 in response to a signal from the fourth node X4. The seventh switching element S7 may control a connection between the second initialization scan clock signal GI CLK2 and the fifth node X5 in response to the signal from the sixth node X6. The sixth switching element S6 may control a connection between the fifth node X5 and the seventh node X7 in response to the second initialization scan clock signal GI CLK2. A first capacitor C1 may control a connection between the high first high voltage VGH1 and the seventh node X7. A second capacitor C2 may be connected between the fifth node X5 and the sixth node X6, and a third capacitor C3 may be connected between the second node X2 and the third node X3. The eleventh switching element S11 may control a connection between the first node X1 and the sixth node X6 in response to the first low voltage VGL1, and the twelfth switching element S12 may control a connection between the fourth node X4 and the eighth node X8 in response to the first low voltage VGL1.

In such an embodiment, the ninth switching element S9 may control a connection between the second high voltage VGH2 and the output terminal in response to the signal from the seventh node X7, and the tenth switching element S10 may control a connection between the second low voltage VGL2 and the output terminal in response to a signal from the eighth node X8. Accordingly, when the output voltages of the initialization scan stages GI_STG are separated from the driving voltage inside the stage and thus the second high voltage VGH2 and the second low voltage VHL2 are applied to the output terminal, the power undesirably consumed in driving the initialization scan stages GI_STG may be minimized. Thus, the display device may improve the overall efficiency of the power consumption.

In an embodiment, the power supply voltage generator 200 may toggle the initialization scan start signal and the initialization scan clock signal inputted to the initialization scan stages GI_STG to the second high voltage VGH2 and the second low voltage VGL2. In such an embodiment, the initialization scan start signal GI FLM and the initialization scan clock signals GI CLK1 and GI CLK2 toggled between the second high voltage VGH2 and the second low voltage VGL2 may be applied to the initialization scan stages GI_STG. Accordingly, since the power consumption by the initialization scan start signal and the initialization scan clock signal is reduced in the initialization scan stages GI_STG, the display device may additionally reduce the power consumption.

Referring to FIG. 6, in the writing scan stages GW_STG, the first transistor M1 may transmit the writing scan start signal GW FLM or the previous output signal POUT to the first node N1 in response to the first writing clock signal GW CLK1 (the second writing clock signal GW CLK2 in the case of an even-numbered stage), the second transistor M2 may transmit the first high voltage VGH1 to the third node N3 in response to the voltage of the second node N2, the third transistor M3 may transmit the voltage of the third node N3 to the first node N1 in response to the second writing clock signal GW CLK2 (the first writing clock signal GW CLK1 in the case of the even-numbered stage), the fourth transistor M4 may transmit the first writing clock signal GW CLK1 (the second writing clock signal GW CLK2 in the case of the even-numbered stage) to the second node N2 in response to the voltage of the first node N1. In such an embodiment, the fifth transistor M5 may transmit the second low voltage VGL2 to the second node N2 in response to the first writing clock signal GW CLK1 (the second writing clock signal GW CLK2 in the case of the even-numbered stage), the sixth transistor M6 may output the first high voltage VGH1 as an output signal OUT to an output node NO in response to the voltage of the second node N2, and the seventh transistor M7 may output the second writing clock signal GW CLK2 (the first writing clock signal GW CLK1 in the case of the even-numbered stage) as the output signal OUT to the output node NO in response to the voltage of the first node N1. In such an embodiment, the first capacitor C1 may be connected between the high first high voltage VGH1 and the second node N2, and the second capacitor C2 may be connected between the first node N1 and the output node NO. Accordingly, since the writing scan stages GW_STG are driven by receiving the second low voltage VGL2 in the above manner, the power undesirably consumed in driving may be minimized compared to a case of being driven by receiving the first low voltage VGL1. In such an embodiment, when the power supply voltage generator 200 outputs the first high voltage VGH1 and the second low voltage VGL2 to the writing scan stages GW_STG as described above, the writing scan start signal GW FLM and the scan clock signals GW CLK1 and GW CLK2 of the writing scan stage may be toggled between the first high voltage VGH1 and the second low voltage VGL2. In such an embodiment, since the power consumption by the writing scan start signal GW FLM and the scan clock signals GW CLK1 and GW CLK2 is reduced in the writing scan stages GW_STG, the display device may additionally reduce the power consumption.

In embodiments of the invention, the display device 100 may selectively output the power supply voltage used for a plurality of stages GW_STG, GC_STG, GI_STG and GB_STG of the scan driver 150, and EM_STG of the emission driver 170, so that the power undesirably consumed in driving the scan driver 150 and the emission driver 170 may be minimized. Thus, the display device 100 may improve the overall efficiency of the power consumption.

Figure 7:
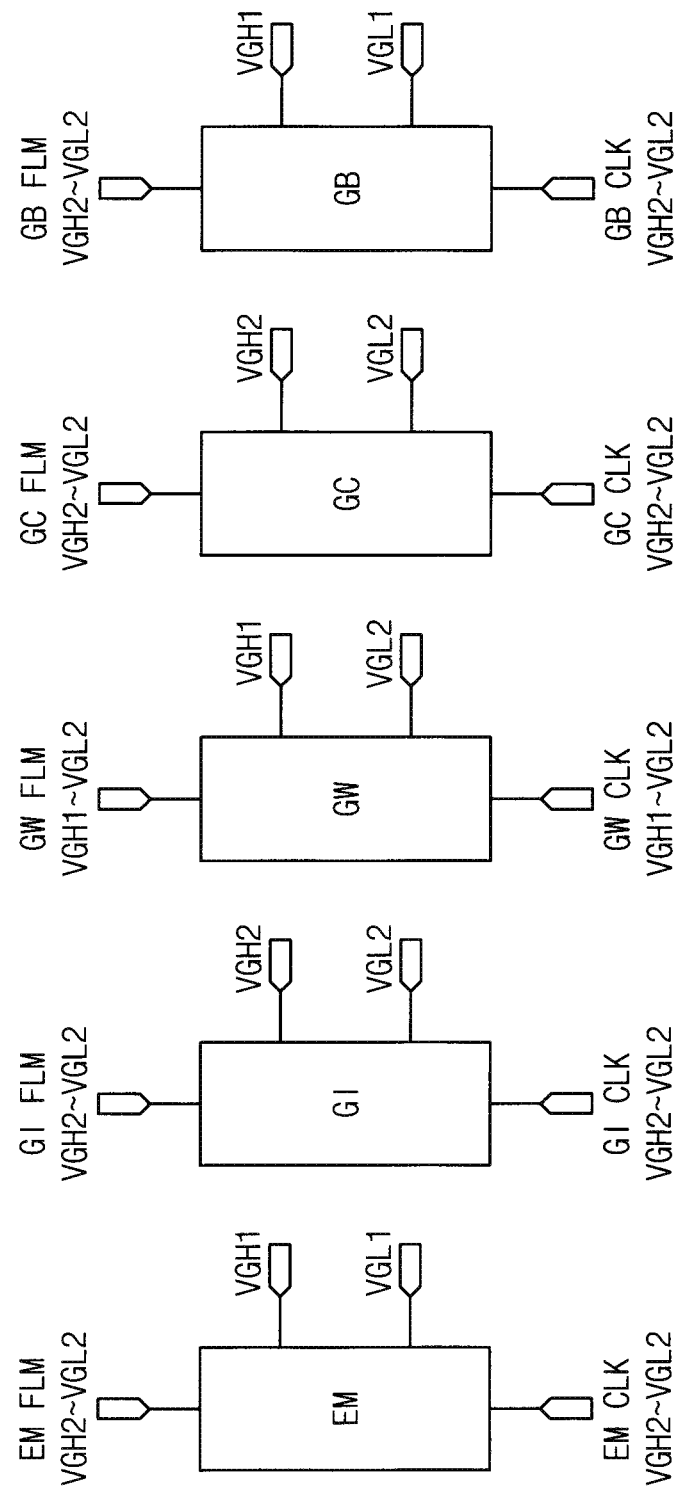
FIG. 7 is a diagram illustrating an alternative embodiment in which the power supply voltage is applied to the scan driver and the emission driver.
Figure 8:
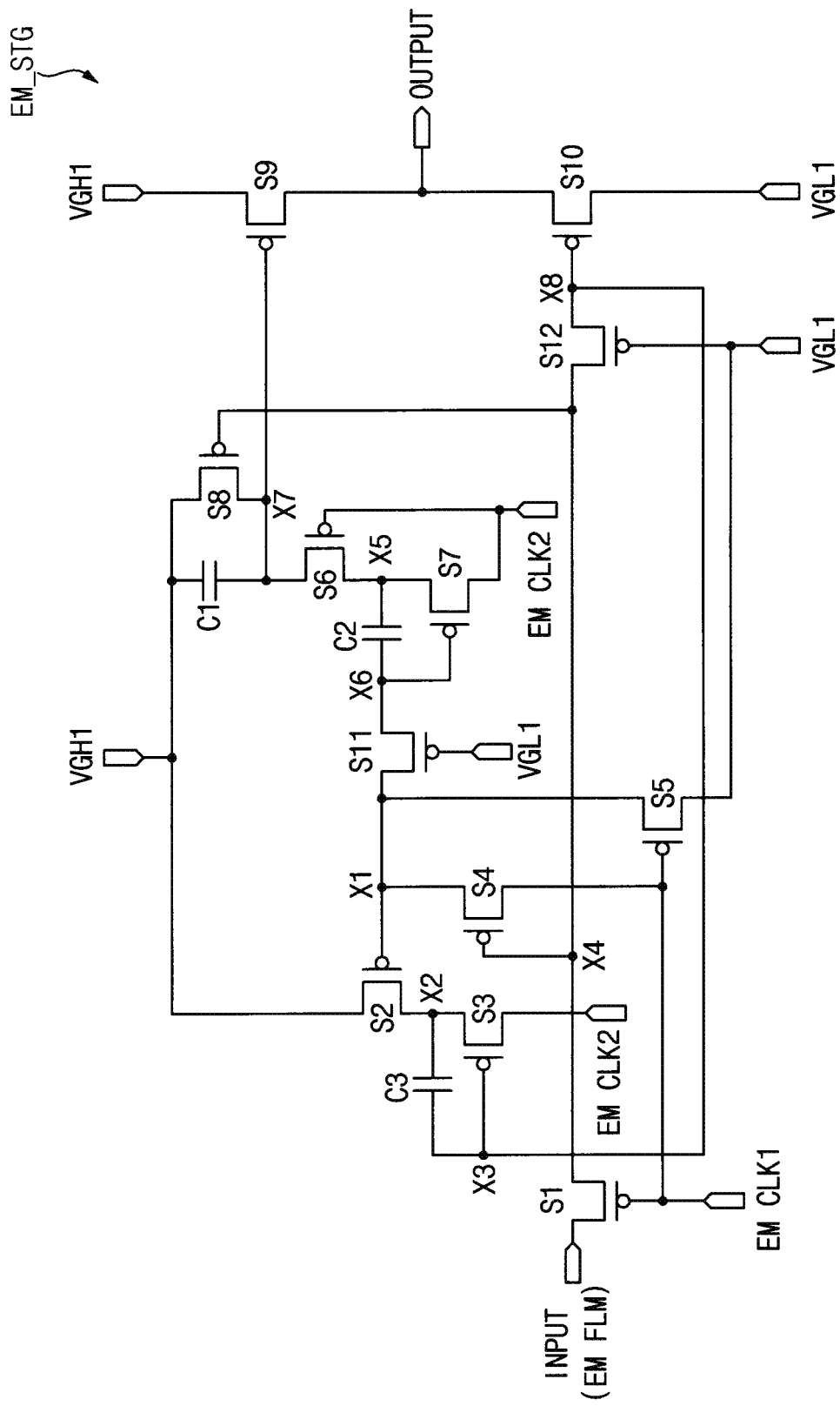
FIG. 8 is a circuit diagram illustrating an emission stage according to an embodiment of the invention.
Figure 9:
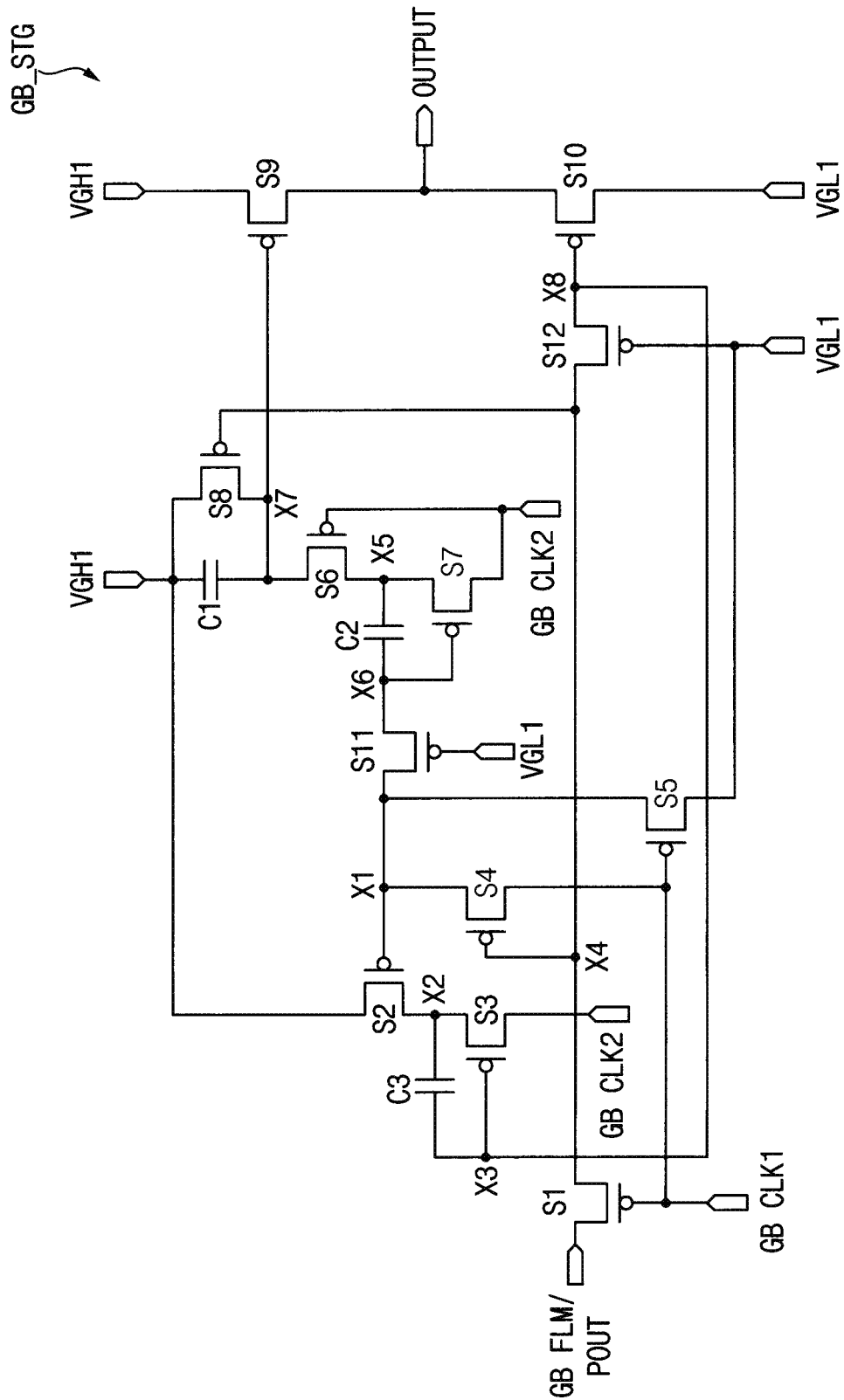
FIG. 9 is a circuit diagram illustrating a bypass scan stage according to an embodiment of the invention.

FIG. 7 is a diagram illustrating an alternative embodiment in which the power supply voltage is applied to the scan driver 150 and the emission driver 170. FIG. 8 is a circuit diagram illustrating the emission stage EM_STG according to an embodiment of the invention. FIG. 9 is a circuit diagram illustrating a bypass scan stage GB_STG according to an embodiment of the invention.

Referring to FIGS. 7 to 9, in an embodiment, the power supply voltage generator 200 may output voltages having different voltage levels from each other to the writing scan stages GW_STG, the compensation scan stages GC_STG, the initialization scan stages GI_STG, the bypass scan stages GB_STG, and the emission stages EM_STG. In such an embodiment, the scan start signal GI FLM, GW FLM, GC FLM or GB FLM and the scan clock signal GI CLK, GW CLK, GC CLK or GB CLK (or emission start signal EM FLM and emission clock signal EM CLK) of at least one selected from the writing scan stages GW_STG, the compensation scan stages GC_STG, the initialization scan stages GI_STG, the bypass scan stages GB_STG, and the emission stages EM_STG may be toggled between the second high voltage VGH2 and the second low voltage VGL2.

In an embodiment, the power supply voltage generator 200 may selectively output one of the first high voltage VGH1 and the second high voltage VGH2 to each of the writing scan stages GW_STG, the compensation scan stages GC_STG, the initialization scan stages GI_STG, the bypass scan stages GB_STG, and the emission stages EM_STG. In such an embodiment, the power supply voltage generator 200 may selectively output one of the first low voltage VGL1 and the second low voltage VGL2 to each of the writing scan stages GW_STG, the compensation scan stages GC_STG, the initialization scan stages GI_STG, the bypass scan stages GB_STG, and the emission stages EM_STG. In one embodiment, for example, the power supply voltage generator 200 may output the first high voltage VGH1 and the first low voltage VGL1 to the bypass scan stages GB_STG and the emission stages EM_STG, may output the second high voltage VGH2 and the second low voltage VGL2 to the compensation scan stages GC_STG and the initialization scan stages GI_STG, and may output the first high voltage VGH1 and the second low voltage VGL2 to the writing scan stages GW_STG.

In an embodiment, the scan start signal GI FLM, GW FLM, GC FLM or GB FLM and the scan clock signal GI CLK, GW CLK, GC CLK or GB CLK (or emission start signal EM FLM and emission clock signal EM CLK) of at least one selected from the writing scan stages GW_STG, the compensation scan stages GC_STG, the initialization scan stages GI_STG, the bypass scan stages GB_STG, and the emission stages EM_STG may be toggled between the second high voltage VGH2 and the second low voltage VGL2. In such an embodiment, the scan start signals GC FLM, GI FLM and GB FLM of the compensation scan stage GC_STG, the initialization scan stage GI_STG and the bypass scan stage GB_STG and scan clock signal of the compensation scan stage GC_STG, the initialization scan stage GI_STG and the bypass scan stage GB_STG may be toggled between the second high voltage VGH2 and the second low voltage VGL2. In such an embodiment, the scan start signal GW FLM and the scan clock signal GW CLK of the writing scan stage GW_STG may be toggled between the first high voltage VGH1 and the second low voltage VGL2. In such an embodiment, the emission start signal EM FLM of the emission stage EM_STG and the emission clock signal EM CLK of the emission stage EM_STG may be toggled between the second high voltage VGH2 and the second low voltage VGL2. In one embodiment, for example, when the power supply voltage generator 200 outputs the second high voltage VGH2 and the second low voltage VGL2 to the compensation scan stages GC_STG, the compensation scan start signal GC FLM and the compensation scan clock signals GC CLK1 and GC CLK2 of the compensation scan stage may be toggled between the second high voltage VGH2 and the second low voltage VGL2. In such an embodiment, when the power supply voltage generator 200 outputs the second high voltage VGH2 and the second low voltage VGL2 to the initialization scan stages GI_STG, the initialization scan start signal GI FLM and the initialization scan clock signals GI CLK1 and GI CLK2 of the initialization scan stage may be toggled between the second high voltage VGH2 and the second low voltage VGL2. In such an embodiment, when the power supply voltage generator 200 outputs the second high voltage VGH2 and the second low voltage VGL2 to the writing scan stages GW_STG, the writing scan start signal GW FLM and the writing scan clock signals GW CLK1 and GW CLK2 of the writing scan stage may be toggled between the first high voltage VGH1 and the second low voltage VGL2. In such an embodiment, since the power consumption by the scan start signal and the scan clock signals is reduced in the scan stages GC_STG, GI_STG, and GW_STG, the display device may additionally reduce the power consumption. The toggling operations of the start signal and the clock signal of the emission stage and the bypass stage will hereinafter be described with reference to FIGS. 8 and 9.

Referring to FIG. 8, the emission stages EM_STG may include a pull-down unit for operations of pulling down the output signal OUTPUT to the first low voltage VGL1. The emission stages EM_STG may include a pull-up unit for operations of raising up the output signal OUTPUT to the first high voltage VGH1. The first switching element S1 may transfer the emission start signal EM FLM to the fourth node X4 in response to the first emission clock signal EM CLK1. The fourth switching element S4 may control a connection between the first emission clock signal EM CLK1 and the first node X1 in response to the signal from the fourth node X4. The fifth switching element S5 may control a connection between the first low voltage VGL1 and the first node X1 in response to the first emission clock signal EM CLK1. Second and third switching elements S2 and S3 may be connected in series between a second node X2 and the first high voltage VGH1. The third switching element S3 may control a connection between the eighth switching element S8 and the second node X2 in response to the second emission clock signal EM CLK2. The eighth switching element S8 may control a connection between the first high voltage VGH1 and a seventh node X7 in response to a signal from the fourth node X4. The seventh switching element S7 may control a connection between the second emission clock signal EM CLK2 and the fifth node X5 in response to the signal from the sixth node X6. The sixth switching element S6 may control a connection between the fifth node X5 and the seventh node X7 in response to the second emission clock signal EM CLK2. A first capacitor C1 may control a connection between the high first high voltage VGH1 and the seventh node X7. A second capacitor C2 may be connected between the fifth node X5 and the sixth node X6, and a third capacitor C3 may be connected between the second node X2 and the third node X3. The eleventh switching element S11 may control a connection between the first node X1 and the sixth node X6 in response to the first low voltage VGL1, and the twelfth switching element S12 may control a connection between the fourth node X4 and the eighth node X8 in response to the first low voltage VGL1.

In such an embodiment, the ninth switching element S9 may control a connection between the first high voltage VGH1 and the output terminal in response to the signal from the seventh node X7, and the tenth switching element S10 may control a connection between the first low voltage VGL1 and the output terminal in response to a signal from the eighth node X8.

In an embodiment, the power supply voltage generator 200 may toggle the emission start signal and the emission clock signal inputted to the emission stages EM_STG to the second high voltage VGH2 and the second low voltage VGL2. In such an embodiment, the emission start signal EM FLM and the emission clock signals EM CLK1 and EM CLK2 toggled between the second high voltage VGH2 and the second low voltage VGL2 may be applied to the emission stages EM_STG. Accordingly, since the power consumption by the emission start signal and the emission clock signal is reduced in the emission stages EM_STG, the display device 100 may reduce the power consumption.

Referring to FIG. 9, the bypass can stages GB_STG may include a pull-down unit for operations of pulling down the output signal OUTPUT to the first low voltage VGL1. The bypass can stages GB_STG may include a pull-up unit for operations of raising up the output signal OUTPUT to the first high voltage VGH1. The first switching element S1 may transfer the bypass scan start signal GB FLM to the fourth node X4 in response to the first bypass scan clock signal GB CLK1. The fourth switching element S4 may control a connection between the first bypass scan clock signal GB CLK1 and the first node X1 in response to the signal from the fourth node X4. The fifth switching element S5 may control a connection between the first low voltage VGL1 and the first node X1 in response to the first bypass scan clock signal GB CLK1. Second and third switching elements S2 and S3 may be connected in series between a second node X2 and the first high voltage VGH1. The third switching element S3 may control a connection between the eighth switching element S8 and the second node X2 in response to the second bypass scan clock signal GB CLK2. The eighth switching element S8 may control a connection between the first high voltage VGH1 and a seventh node X7 in response to a signal from the fourth node X4. The seventh switching element S7 may control a connection between the second bypass scan clock signal GB CLK2 and the fifth node X5 in response to the signal from the sixth node X6. The sixth switching element S6 may control a connection between the fifth node X5 and the seventh node X7 in response to the second bypass scan clock signal GB CLK2. A first capacitor C1 may control a connection between the high first high voltage VGH1 and the seventh node X7. A second capacitor C2 may be connected between the fifth node X5 and the sixth node X6, and a third capacitor C3 may be connected between the second node X2 and the third node X3. The eleventh switching element S11 may control a connection between the first node X1 and the sixth node X6 in response to the first low voltage VGL1, and the twelfth switching element S12 may control a connection between the fourth node X4 and the eighth node X8 in response to the first low voltage VGL1.

In such an embodiment, the ninth switching element S9 may control a connection between the first high voltage VGH1 and the output terminal in response to the signal from the seventh node X7, and the tenth switching element S10 may control a connection between the first low voltage VGL1 and the output terminal in response to a signal from the eighth node X8.

In an embodiment, the power supply voltage generator 200 may toggle the bypass scan start signal and the bypass scan clock signal inputted to the bypass scan stages GB_STG to the second high voltage VGH2 and the second low voltage VGL2. In such an embodiment, the bypass scan start signal GB FLM and the bypass scan clock signals GB CLK1 and GB CLK2 toggled between the second high voltage VGH2 and the second low voltage VGL2 may be applied to the bypass scan stages GB_STG. Accordingly, since the power consumption by the bypass scan start signal and the bypass scan clock signal is reduced in the bypass scan stages GB_STG, the display device 100 may reduce the power consumption.

In embodiments of the invention, the display device 100 may selectively output the power supply voltage required for a plurality of stages GW_STG, GC_STG, GI_STG and GB_STG of the scan driver 150, and EM_STG of the emission driver 170, so that the power undesirably consumed in driving the scan driver 150 and the emission driver 170 may be minimized. Thus, the display device 100 may improve the overall efficiency of the power consumption.

Figure 10:
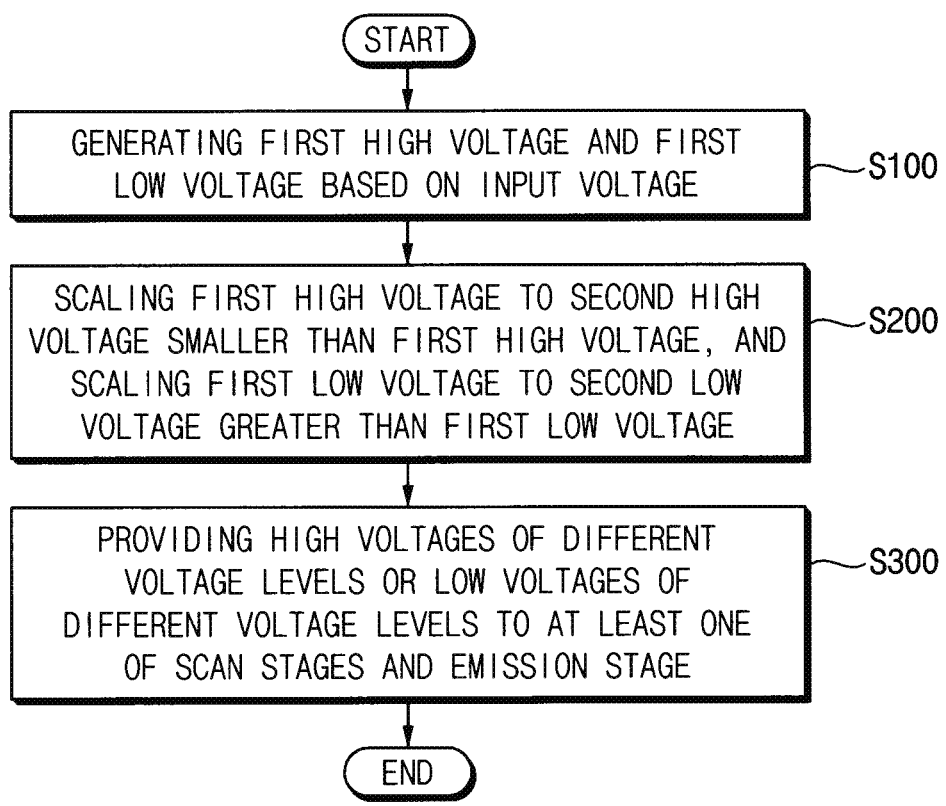
FIG. 10 is a flow chart illustrating operations of the display device according to an embodiment of the invention.

FIG. 10 is a flow chart illustrating operations of the display device 100 according to an embodiment of the invention.

Referring to FIGS. 1 to 4 and 10, the display device 100 may generates the first high voltage VGH1 and the first low voltage VGL1 based on the input voltage (S100), may scale the first high voltage VGH1 to the second high voltage VGH2 less or lower than the first high voltage VGH1, and scale the first low voltage VGL1 to the second low voltage VGL2 greater or higher than the first low voltage VGL1 (S200), and may provide high voltages having different voltage levels from each other or low voltages having different voltage levels from each other to at least one selected from the scan stages and the emission stage (S300).

In an embodiment, the display device 100 may generate the first high voltage VGH1 and the first low voltage VGL1 based on the input voltage (S100). in such an embodiment, the voltage generating block 210 may receive an input voltage VIN and generate high voltages VGH and low voltages VGL for driving the scan driver 150 and the emission driver 170. In one embodiment, for example, the voltage generating block 210 may generate the first high voltage VGH1 and the first low voltage VGL1, and output the first high voltage VGH1 and the first low voltage VGL1 to the scan driver 150 and the emission driver 170. In such an embodiment, the voltage generating block 210 may transfer the first high voltage VGH1 and the first low voltage VGL1 to the voltage scaling block 220.

In an embodiment, the display device 100 may scale the first high voltage VGH1 to the second high voltage VGH2 less or lower than the first high voltage VGH1, and scale the first low voltage VGL1 to the second low voltage VGL2 greater or higher than the first low voltage VGL1 (S200). In such an embodiment, the voltage scaling block 220 may receive the first high voltage VGH1 and the first low voltage VGL1 from the voltage generating block 210. The voltage scaling block 220 may scale the first high voltage VGH1 to the second high voltage VGH2 lower than the first high voltage VGH1, and the voltage scaling block 220 may scale the first low voltage VGL1 to the second low voltage VGL2 higher than the first low voltage VGL1. The voltage scaling block 220 may output the second high voltage VGH2 and the second low voltage VGL2 to the scan driver 150 and the emission driver 170. In such an embodiment, the voltage scaling block 220 may determine magnitudes of the second high voltage VGH2 and the second low voltage VGL2 based on previously stored data. In such an embodiment, the voltage generator may store a data sheet including optimal driving voltage information of each of the scan stages and the emission stages according to the input voltage. The voltage scaling block 220 may determine the magnitudes of the second high voltage VGH2 and the second low voltage VGL2 based on the data stored in the data sheet, and accordingly, scale the second high voltage VGH2 and the second low voltage VGL2.

In an embodiment, the display device 100 may provide high voltages having different voltage levels from each other or low voltages having different voltage levels from each other to at least one selected from the scan stages and the emission stage (S300). In such an embodiment, the power supply voltage generator 200 may output voltages having different voltage levels from each other to the writing scan stages GW_STG, the compensation scan stages GC_STG, the initialization scan stages GI_STG, the bypass scan stages GB_STG, and the emission stages EM_STG. In an embodiment, the power supply voltage generator 200 may selectively output one of the first high voltage VGH1 and the second high voltage VGH2 to each of the writing scan stages GW_STG, the compensation scan stages GC_STG, the initialization scan stages GI_STG, the bypass scan stages GB_STG, and the emission stages EM_STG. In such an embodiment, the power supply voltage generator 200 may selectively output one of the first low voltage VGL1 and the second low voltage VGL2 to each of the writing scan stages GW_STG, the compensation scan stages GC_STG, the initialization scan stages GI_STG, the bypass scan stages GB_STG, and the emission stages EM_STG. Accordingly, since each of the stages is driven using the predetermined voltage used for the stages GW_STG, GC_STG, GI_STG, GB_STG, and EM_STG, the power consumption may be reduced.

In an embodiment, the scan start signal and the scan clock signal (or emission start signal and emission clock signal) of at least one selected from the writing scan stages GW_STG, the compensation scan stages GC_STG, the initialization scan stages GI_STG, the bypass scan stages GB_STG, and the emission stages EM_STG that are included in the display device 100 may be toggled between the second high voltage VGH2 and the second low voltage VGL2. Since the power consumption by the scan start signal and the scan clock signal (or the emission start signal and the emission clock signal) is reduced in the stages, the display device may additionally reduce the power consumption. Accordingly, in such an embodiment, the display device 100 may selectively output the power supply voltage required for a plurality of stages GW_STG, GC_STG, GI_STG and GB_STG of the scan driver 150, and EM_STG of the emission driver 170, so that the power undesirably consumed in driving the scan driver 150 and the emission driver 170 may be minimized. Thus, the display device 100 may improve the overall efficiency of the power consumption.

Figure 11:
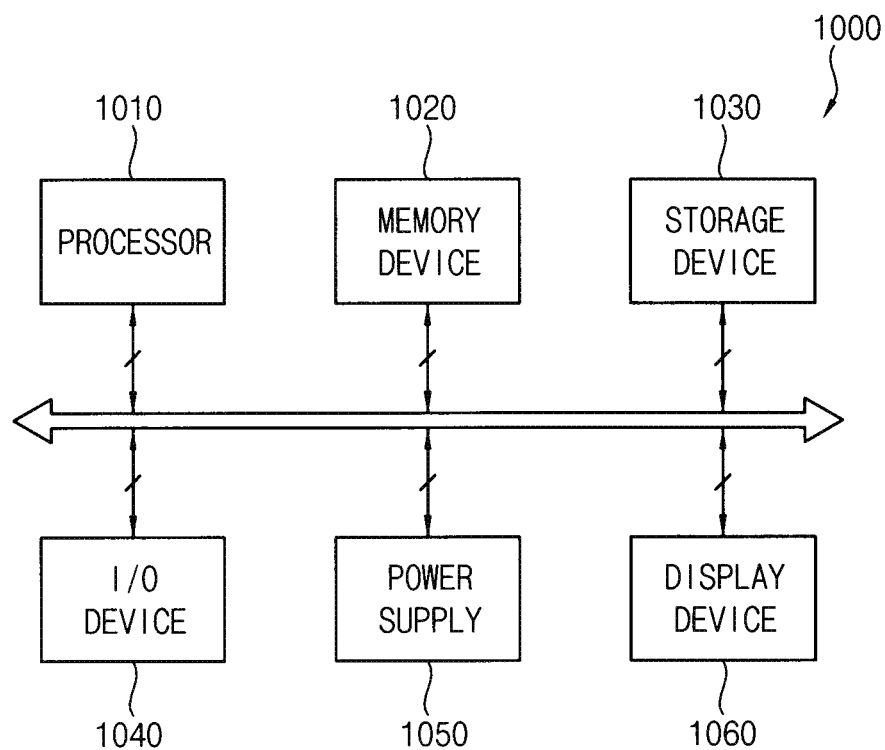
FIG. 11 is a block diagram illustrating an electronic device according to an embodiment of the invention.
Figure 12:
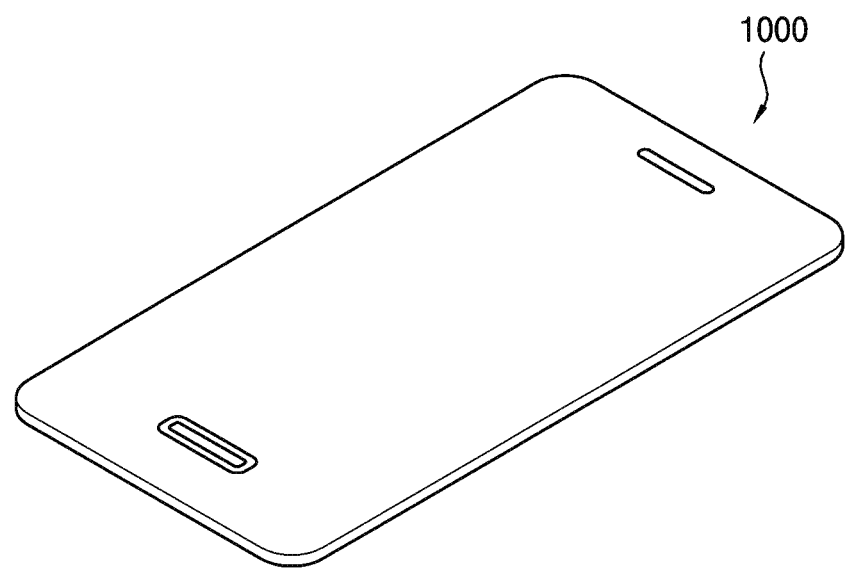
FIG. 12 is a diagram illustrating an embodiment in which the electronic device of FIG. 11 is implemented as a smartphone.

FIG. 11 is a block diagram illustrating an electronic device according to embodiments of the invention, and FIG. 12 is a diagram illustrating an embodiment in which the electronic device of FIG. 11 is implemented as a smart phone.

Referring to FIGS. 11 and 12, an embodiment of the electronic device 1000 may include a processor 1010, a memory device 1020, a storage device 1030, an input/output ("I/O") device 1040, a power supply 1050, and a display device 1060. In such an embodiment, the display device 1060 may be the display device 10 of FIG. 1. In such an embodiment, the electronic device 1000 may further include a plurality of ports for communicating with a video card, a sound card, a memory card, a universal serial bus ("USB") device, other electronic device, and the like. In an embodiment, as illustrated in FIG. 12, the electronic device 1000 may be implemented as a smart phone. However, the electronic device 1000 is not limited thereto. In one alternative embodiment, for example, the electronic device 1000 may be implemented as a cellular phone, a video phone, a smart pad, a smart watch, a tablet personal computer ("PC"), a car navigation system, a computer monitor, a laptop, a head mounted display ("HMD") device, or the like.

The processor 1010 may perform various computing functions. The processor 1010 may be a micro-processor, a central processing unit ("CPU"), an application processor ("AP"), or the like. The processor 1010 may be connected to other components via an address bus, a control bus, a data bus, or the like. In an embodiment, the processor 1010 may be connected to an extended bus such as a peripheral component interconnection ("PCI") bus. The memory device 1020 may store data for operations of the electronic device 1000. In one embodiment, for example, the memory device 1020 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, and the like and/or at least one volatile memory device such as a dynamic random access memory ("DRAM") device, a static random access memory ("SRAM") device, a mobile DRAM device, and the like. The storage device 1030 may include a solid state drive ("SSD") device, a hard disk drive ("HDD") device, a CD-ROM device, or the like. The I/O device 1040 may include an input device such as a keyboard, a keypad, a mouse device, a touch-pad, a touch-screen, and the like, and an output device such as a printer, a speaker, or the like. In an embodiment, the I/O device 1040 may include the display device 1060. The power supply 1050 may provide power for operations of the electronic device 1000.

In an embodiment, the display device 1060 may display an image corresponding to visual information of the electronic device 1000. In such an embodiment, The display device 1060 may include a display panel including a plurality of pixels, a data driver which applies data signals to the display panel, a scan driver including a plurality of scan stages, which sequentially applies scan signals to the display panel, an emission driver including an emission stage which sequentially applies emission signals to the display panel, a controller which controls the scan driver, the emission driver and the data driver, and a power supply voltage generator which generates a power supply voltage including high voltages and low voltages, and provides the high voltages having different voltage levels from each other or the low voltages having different voltage levels from each other to at least one selected from the scan stages and the emission stage. In such an embodiment, the power supply voltage generator generates a first high voltage, a first low voltage, a second high voltage lower than the first high voltage, and a second low voltage higher than the first low voltage based on an input voltage. The display device 1060 may selectively output the power supply voltage used for the stages of the scan driver and the emission driver, so that the power undesirably consumed in driving the scan driver and the emission driver may be minimized. Accordingly, the display device may improve the overall efficiency of the power consumption, as described herein.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
    a display panel including a plurality of pixels;
    a data driver which applies data signals to the display panel;
    a scan driver including a plurality of scan stages, which sequentially applies scan signals to the display panel;
    an emission driver including an emission stage which sequentially applies emission signals to the display panel;
    a controller which controls the scan driver, the emission driver, and the data driver; and
    a power supply voltage generator which generates a power supply voltage including high voltages and low voltages, and provides the high voltages having different voltage levels from each other or the low voltages having different voltage levels from each other to at least one selected from the scan stages and the emission stage, wherein
    the power supply voltage generator generates a first high voltage, a first low voltage lower than the first high voltage, a second high voltage lower than the first high voltage and higher than the first low voltage, and a second low voltage higher than the first low voltage based on an input voltage,
    wherein the second high voltage and the second low voltage are scaled from the first high voltage and the first low voltage, respectively.

2. The display device of claim 1, wherein the power supply voltage generator includes:
    a voltage generating block which generates the first high voltage and the first low voltage based on the input voltage; and
    a voltage scaling block which scales the first high voltage to the second high voltage, and scales the first low voltage to the second low voltage.

3. The display device of claim 2, wherein the scan stages include a writing scan stage, a compensation scan stage, an initialization scan stage, and a bypass scan stage.

4. The display device of claim 3, wherein a scan start signal of the at least one selected from the scan stages and a scan clock signal of at least one selected from the scan stages are toggled between the second high voltage and the second low voltage.

5. The display device of claim 4, wherein the voltage scaling block determines magnitudes of the second high voltage and the second low voltage based on previously stored data.

6. The display device of claim 4, wherein the power supply voltage generator provides the second high voltage and the second low voltage to the compensation scan stage and the initialization scan stage.

7. The display device of claim 6, wherein scan start signals of the compensation scan stage and the initialization scan stage, and scan clock signals of the compensation scan stage and the initialization scan stage are toggled between the second high voltage and the second low voltage.

8. The display device of claim 6, wherein the power supply voltage generator provides the first high voltage and the second low voltage to the writing scan stage.

9. The display device of claim 8, wherein a scan start signal of the writing scan stage and a scan clock signal of the writing scan stage are toggled between the first high voltage and the second low voltage.

10. The display device of claim 6, wherein an emission start signal of the emission stage and an emission clock signal of the emission stage are toggled between the second high voltage and the second low voltage.

11. The display device of claim 6, wherein a scan start signal of the bypass scan stage and a scan clock signal of the bypass scan stage are toggled between the second high voltage and the second low voltage.

12. A method of operating a display device, the method comprising:

generating a first high voltage and a first low voltage based on an input voltage;

scaling the first high voltage to a second high voltage lower than the first high voltage, and scaling the first low voltage lower than the first high voltage and second high voltage to a second low voltage higher than the first low voltage; and providing high voltages having different voltage levels from each other or low voltages having different voltage levels from each other to at least one selected from scan stages and an emission stage of the display device.

13. The method of claim 12, wherein the scan stages include a writing scan stage, a compensation scan stage, an initialization scan stage, and a bypass scan stage.

14. The method of claim 13, wherein the scaling the first high voltage to the second high voltage and the scaling the first low voltage to the second low voltage includes determining magnitudes of the second high voltage and the second low voltage based on previously stored data.

15. The method of claim 13, wherein the providing the high voltages having the different voltage levels from each other or the low voltages having the different voltage levels from each other includes providing the second high voltage and the second low voltage to the compensation scan stage and the initialization scan stage.

16. The method of claim 15, wherein scan start signals of the compensation scan stage and the initialization scan stage, and scan clock signals of the compensation scan stage and the initialization scan stage are toggled between the second high voltage and the second low voltage.

17. The method of claim 15, wherein the providing the high voltages having the different voltage levels from each other or the low voltages having the different voltage levels from each other includes providing the first high voltage and the second low voltage to the writing scan stage.

18. The method of claim 17, wherein a scan start signal of the writing scan stage and a scan clock signal of the writing scan stage are toggled between the first high voltage and the second low voltage.

19. The method of claim 15, wherein an emission start signal of the emission stage and an emission clock signal of the emission stage are toggled between the second high voltage and the second low voltage.

20. The method of claim 15, wherein a scan start signal of the bypass scan stage and a scan clock signal of the bypass scan stage are toggled between the second high voltage and the second low voltage.

* * * * *